United States Patent [19]

Ruh

[11] Patent Number: 5,592,578
[45] Date of Patent: Jan. 7, 1997

[54] PERIPHERAL OPTICAL ELEMENT FOR REDIRECTING LIGHT FROM AN LED

[75] Inventor: Richard A. Ruh, Monte Sereno, Calif.

[73] Assignee: Hewlett-Packard Company, Palo Alto, Calif.

[21] Appl. No.: 548,309

[22] Filed: Nov. 1, 1995

[51] Int. Cl.[6] .............................. G02B 6/00; G02B 6/26; G02B 6/42
[52] U.S. Cl. ............................................................. 385/31
[58] Field of Search .................................. 385/31, 39, 53, 385/147

[56] References Cited

U.S. PATENT DOCUMENTS

| | | | |
|---|---|---|---|
| 4,130,343 | 12/1978 | Miller et al. | 385/49 |
| 4,181,439 | 1/1980 | Tresch et al. | 250/574 |
| 4,277,134 | 7/1981 | Upton, Jr. | 385/26 |
| 5,371,347 | 12/1994 | Plesko | 250/235 |
| 5,519,198 | 5/1996 | Plesko | 359/214 |

*Primary Examiner*—Akm E. Ullah
*Attorney, Agent, or Firm*—John L. Imperato

[57] ABSTRACT

A peripheral optical element efficiently collects light emitted by a light emitting diode (LED) to produce a high luminous intensity of emitted light within a limited viewing angle relative to an optical axis. An LED is positioned in the center of the peripheral optical element, the element comprising a base, a refractive and reflective surface, and an exiting surface. In one preferred embodiment of the present invention, the peripheral optical element is radially symmetric to form a ring element. In an alternative embodiment of the present invention an array of multiple peripheral optical elements is mounted in a frame to accommodate multiple LEDs, forming a light panel for power signaling applications.

12 Claims, 4 Drawing Sheets

5,592,578

PERIPHERAL OPTICAL ELEMENT FOR REDIRECTING LIGHT FROM AN LED

FIELD OF THE INVENTION

This invention discloses an optical element for controlling the viewing angle of light produced by light emitting diodes (LEDs).

BACKGROUND OF THE INVENTION

Due to their compact size, high efficiency and long lifetimes, light emitting diodes (LEDs) have replaced incandescent light sources in a variety of power signaling applications which require high intensity, colored light. Although light emitted by LEDs is inherently dispersed over a wide angle, automotive tail lamps, traffic signal lights, moving message displays and other power signaling applications require that light be confined within a narrow viewing angle. In fact, the Society of Automotive Engineers (SAE) specifies luminous intensity versus viewing angle relative to an optical axis in the horizontal and vertical planes for automotive tail lamps. Various systems have been used to efficiently redirect the light from LEDs in order to achieve a high luminous intensity within a desired viewing angle.

In the Ford Motor Company's model Taurus SHO center stop lamp, a lens is positioned in front of an LED. The lens, in conjunction with a metallized parabolic surface placed behind the lens, redirects light emitted by the LED into a narrow viewing angle. Although light is efficiently redirected, the metallized surface increases manufacturing costs for this type of system.

A prior art collimator for an LED array is taught by Nichols et al. in U.S. Pat. No. 4,767,172. Nichols et al. utilizes a lens in front of an LED in combination with a transparent integral collector to collimate light parallel to an optical axis for projection into a light pipe or optical waveguide. Although this type of collimator efficiently redirects light, and may have low manufacturing cost, the light is limited to on-axis viewing, making this type of system unsuitable for power signaling applications.

SUMMARY OF THE INVENTION

In a preferred embodiment of the present invention, a peripheral optical element efficiently collects light from an LED to produce high luminous intensity within a limited, narrow, predefined viewing angle relative to an optical axis. An LED is centered within the peripheral optical element, while a refracting surface directs light into the peripheral optical element. The light is then totally internally reflected by a reflecting surface and leaves the peripheral optical element through an exit surface. The viewing angle corresponds to the angles of the refractive and reflective surfaces relative to the optical axis. In one embodiment of the present invention the peripheral optical element is radially symmetric to form a ring element. In an alternate embodiment of the present invention, multiple peripheral optical elements are integrated into an array to accommodate multiple LEDs. The peripheral optical element, readily molded from polymethyl methacrylate or similar material, has a low manufacturing cost and is well suited for power signaling applications.

DETAILED DESCRIPTION OF THE PREFERRED EMBODIMENT

Figure 1:
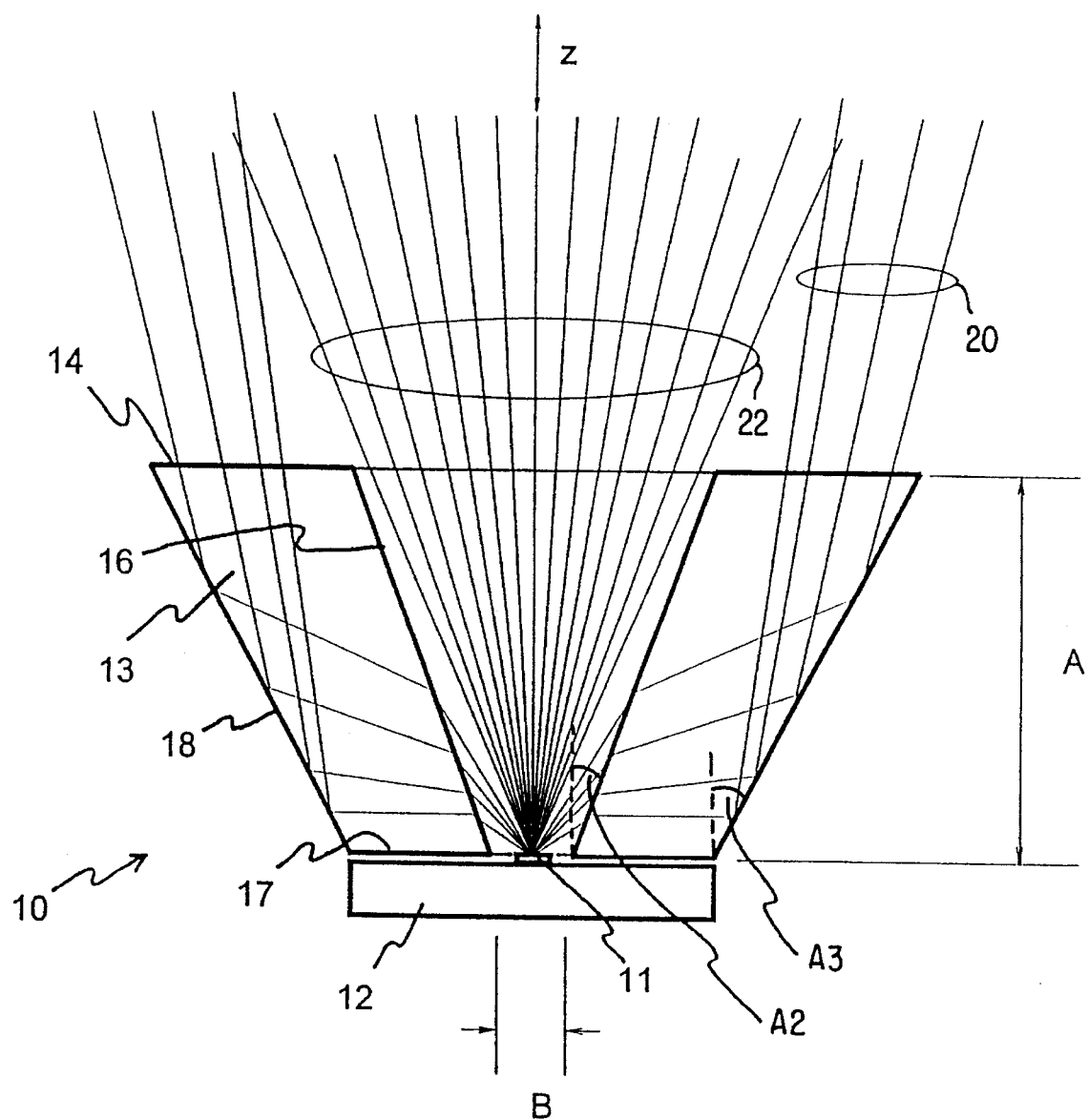
FIG. 1 is a cross-sectional view of a first illustrated preferred embodiment of the present invention.

FIG. 1 is a cross-sectional view of peripheral optical element 10, hereinafter optical element 10. A body 13 of optical element 10 is symmetric about an optical axis z in the plane of the cross-sectional view. The optical element 10 is mounted with its base surface 17 on top of carrier 12 of LED 11. LED 11 is centered in an aperture of width W within base surface 17. The optical paths 20,22 of light emitted by LED 11 are shown. Some of LED 11's emitted light, unintercepted light 22, is within a small enough angle to optical axis Z, is not intercepted by body 13 and is unaffected by the action of the optical element 10. Light that is emitted by the LED 11 at larger angles to the optical axis Z, intercepted light 20, is intercepted by refracting surface 16 of optical element 10.

The refractive index of the optical element 10 is higher than that of the surrounding medium, which is typically air, causing intercepted light 20 to refract away from the optical axis Z and into body 13. The light within body 13 is totally internally reflected at a reflective surface 18 and is directed at a decreased angle relative to the optical axis Z. Since light is totally internally reflected by the reflective surface 18, the reflective surface may be optically transmissive or it may be formed from an optically reflective material.

Light then leaves body 13 through an exit surface 14. The exit surface 14 is shown to be flat. Additional directing of light may be achieved by forming the exit surface 14 to another shape, such as a convex or concave curve or it may be chamfered. The refractive surface angle A2, the reflective surface angle A3, the height H of the exit surface 14 and the aperture width W within the base surface 17 are chosen to tailor the viewing angle, the angular sector about the optical axis z within which a defined percentage of the light emitted by LED 11 is contained.

Figure 2:
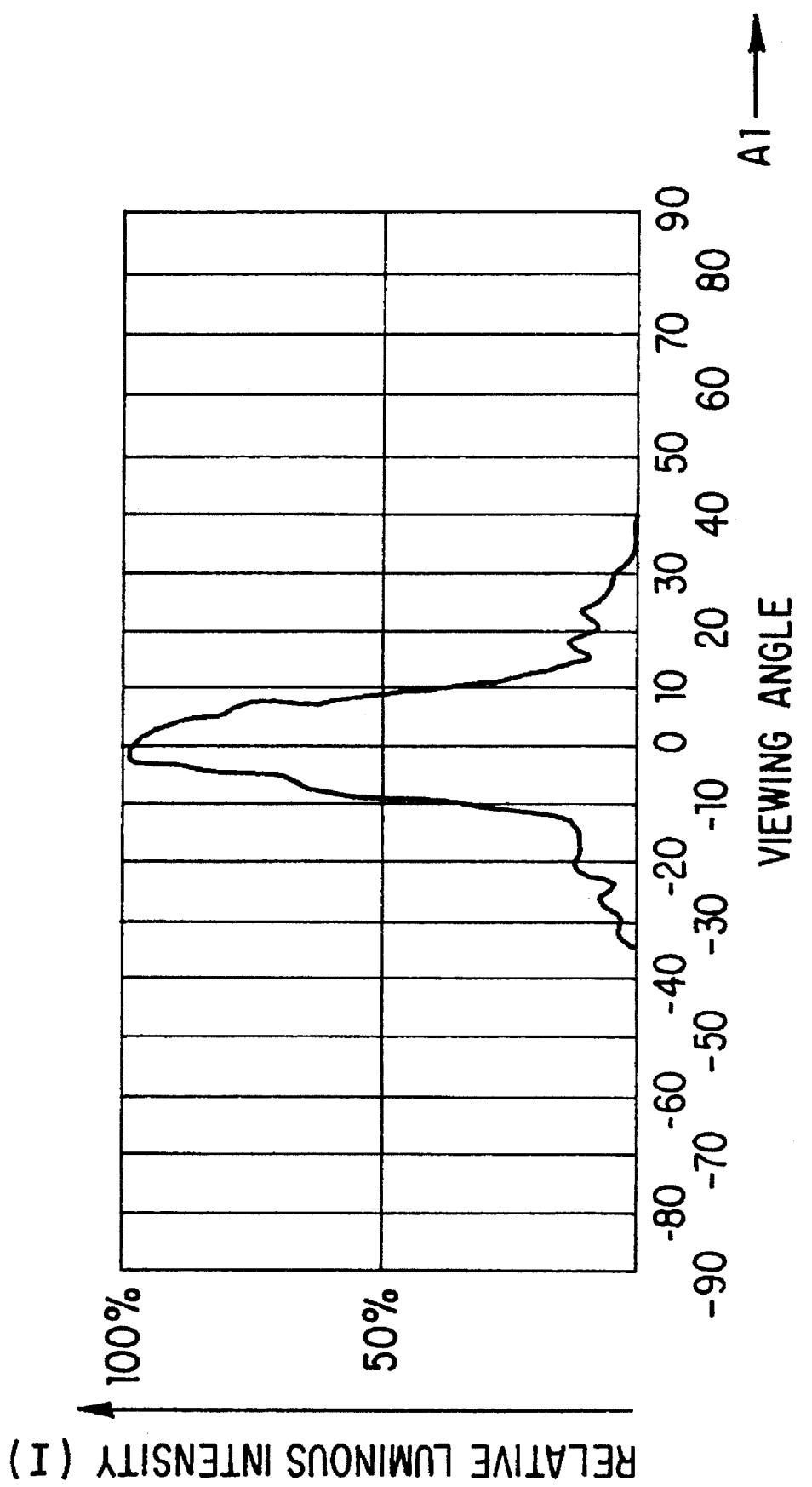
FIG. 2 shows a plot of relative luminous intensity versus viewing angle for the preferred embodiment of FIG. 1.

FIG. 2 shows a plot of relative luminous intensity I versus viewing angle A1 for the optical element 10. Viewing angle A1 is observed in the plane of the optical element 10 containing the optical axis Z. Viewing angle A1 is displayed relative to the optical axis Z which corresponds to 0° in the plot. Although LED 11 may distribute light over a wide angle relative to the optical axis Z, such as plus or minus 45°, optical element 10 redirects the emitted light into a narrow angle, such as plus or minus 15°, making optical element 10 ideally suited for power signaling applications requiring limited viewing angles A1. This particular luminous intensity I versus viewing angle A1 is achieved with refractive surface angle A2 equal to 25°, reflective surface angle A3 equal to 40°, height H of exit surface 14 equal to 6 millimeters and a base surface 17 length of 2.9 millimeters. The aperture width W within the base surface 17 is 3.2 millimeters. The luminous intensity I profile is readily tailored by choosing the reflecting surface angle A3, the refractive surface angle A2, the length of base surface 17, and the height H of exit surface 14. The refractive index of the material used to construct the optical element 10 also affects the profile of the luminous intensity I versus viewing angle A1. For example, if optical element 10 is constructed from glass, the refractive index can be increased or decreased so as to achieve a desired luminous intensity I versus viewing angle A1 profile. The luminous intensity I versus viewing angle A1 is tailored in each viewing plane of rotation about the optical axis Z, by the cross-sectional shape for the optical element 10 in each of the viewing planes.

Figure 3:
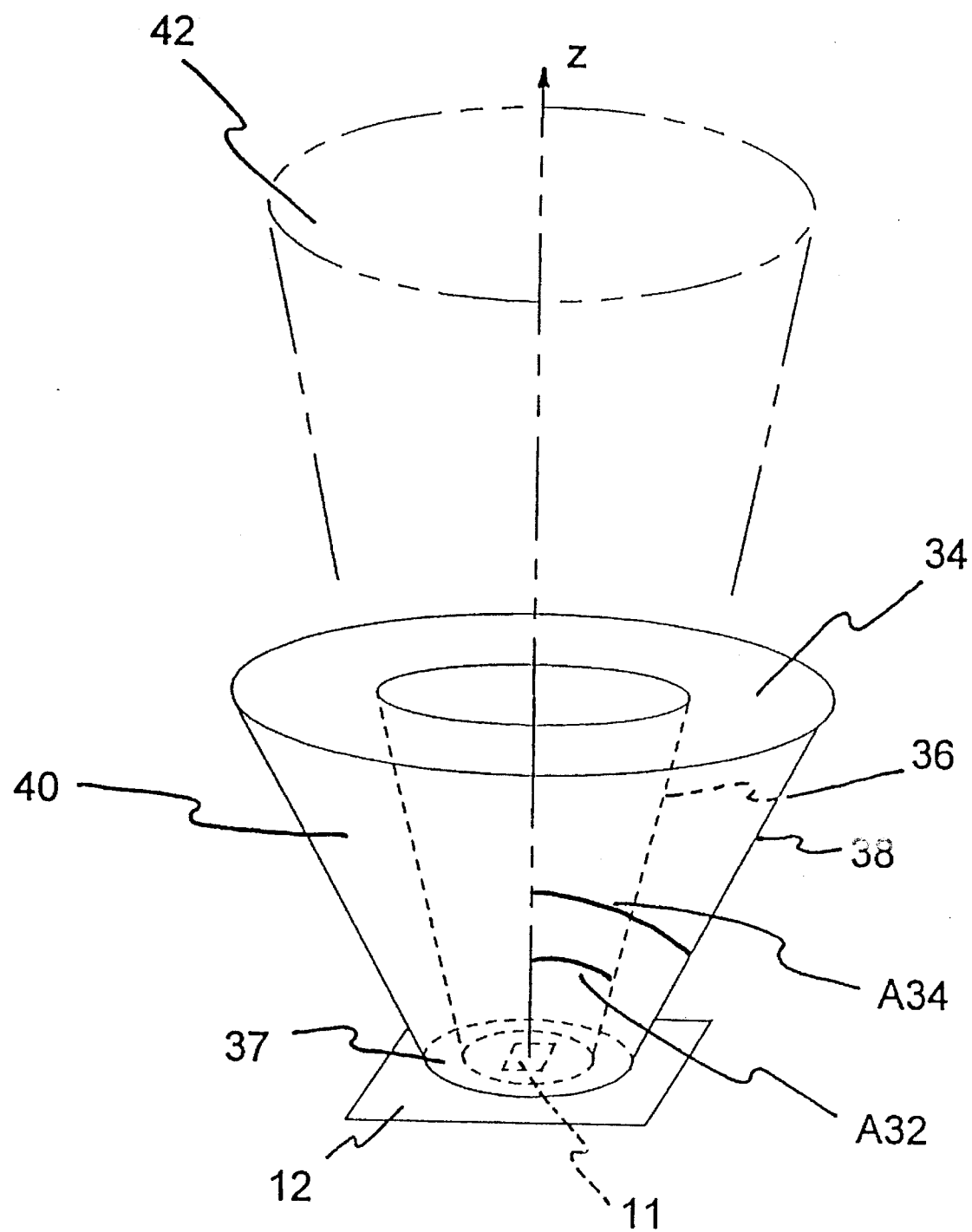
FIG. 3 shows a perspective view of a second preferred embodiment of the present invention.

FIG. 3 is a perspective view of a ring element 40 constructed in accordance to a second preferred embodiment of the present invention. The ring element 40 is radially symmetric about the optical axis Z. Light from LED 11 mounted beneath the ring element 40 is redirected within a predetermined viewing sector of luminous intensity I forming a cone 42 about the optical axis Z. Ring element 40 is defined by a pair of truncated concentric conic surfaces, an inner refractive surface 36 and an outer reflective surface 38. The inner refractive surface forms a first angle A32 to the optical axis Z, while the outer reflective surface 38 forms a second angle A34, acute to the optical axis z and greater than the first angle A32. Ring element 40 is bounded on the top by annular exit surface 34 and bounded on the bottom by annular base surface 37. The ring element 40 is fabricated from plastic resins such as polymethyl methacrylate, polycarbonate or other materials that are optically transmissive to the light emitted by the LED 11. The ring element 40 when used in conjunction with a light emitter such as an LED 11 forms a light source having a high luminous intensity I within a predetermined viewing angle and is well suited for use in a variety of power signaling applications.

Figure 4:
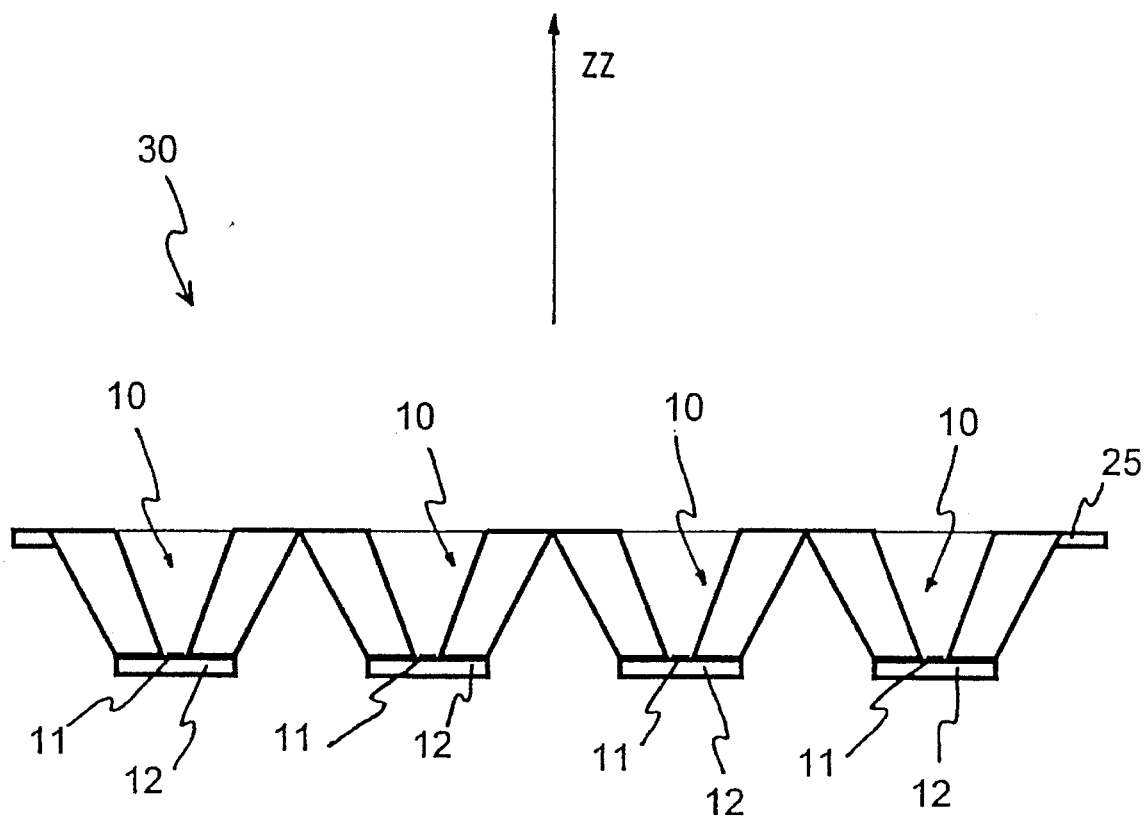
FIG. 4 shows a third preferred embodiment of the present invention.

FIG. 4 is a cross-sectional view of an array 30 of optical elements 10 that is constructed in accordance to a third illustrated preferred embodiment of the present invention. Multiple optical elements 10 are integrated into a frame 25 forming an array 30 to accommodate multiple LEDs 11 for use in power signaling applications such as automotive tail lamps. Illuminated by LEDs 11, array 30 forms a light panel having a large area of illumination that produces light within a limited viewing angle relative to an array optical axis ZZ.

I claim:

1. A peripheral optical element for redirecting dispersed light into a predetermined viewing angle relative to an optical axis, the peripheral optical element comprising:
   a pair of coplanar base surfaces each having an inside and an outside edge, perpendicular to the optical axis, offset from the optical axis;
   a pair of refracting surfaces, each refracting surface adjacent to the inside edge of each base surface and at a first acute angle to the optical axis;
   a pair of reflecting surfaces, each reflecting surface adjacent to the outside edge of each base surface, and at a second acute angle to the optical axis wherein the second acute angle is greater than the first acute angle; and
   a pair of exiting surfaces adjacent to the reflecting and refracting surfaces.

2. The peripheral optical element of claim 1 wherein the pair of exiting surfaces is coplanar and parallel to the pair of coplanar base surfaces.

3. The peripheral optical element of claim 2 wherein the base surfaces, the refracting surfaces, and the exiting surfaces are optically transmissive.

4. The peripheral optical element of claim 3 wherein the reflecting surfaces are optically transmissive.

5. The peripheral optical element of claim 3 wherein the refracting surfaces, the reflecting surfaces, the base surfaces and the exiting surfaces are rotationally symmetric about the optical axis.

6. A light source producing a cone of luminous intensity centered about an optical axis, comprising:
   a radially symmetric peripheral optical element defined by;
      a pair of conic surfaces disposed about the optical axis, the first conic surface of the pair at a first acute angle to the optical axis, the second conic surface of the pair at a second acute angle to the optical axis greater than the first acute angle,
      an annular base surface formed by truncating the cones in a first plane perpendicular to the optical axis; and
      an annular exit surface formed by truncating the cones in a second plane perpendicular to the optical axis; and
   a light emitting diode centered within the annular base surface.

7. The light source of claim 6 wherein the first conic surface, the annular base surface and the annular exit surface are optically transmissive to light produced by the light emitting diode.

8. The light source of claim 7 wherein the second conic surface is optically transmissive to light produced by the light emitting diode.

9. The light source of claim 8 wherein the peripheral optical element is fabricated from polymethyl methacrylate.

10. The light source of claim 8 wherein the peripheral optical element is fabricated from polycarbonate.

11. An array of peripheral optical elements for directing light within a predetermined viewing angle relative to an optical axis, comprising:
    multiple peripheral optical elements, in cross-section each peripheral optical element including;
       a pair of coplanar base surfaces each having an inside and an outside edge, perpendicular to the optical axis, offset from the optical axis,
       a pair of refracting surfaces, each refracting surface adjacent to the inside edge of each base surface and at a first acute angle to the optical axis,
       a pair of reflecting surfaces, each reflecting surface adjacent to the outside edge of each base surface, and at a second acute angle to the optical axis wherein the second acute angle is greater than the first acute angle,
       a pair of coplanar exiting surfaces, each exiting surface perpendicular to the optical axis, adjacent to the reflecting and refracting surfaces; and
    a frame, continuous with the multiple peripheral optical elements.

12. The array of claim 11 further comprising multiple light emitting diodes, each light emitting diode positioned coplanar to the base surface of a corresponding peripheral optical element of the array.

* * * * *